(12) United States Patent
Endoh et al.

(10) Patent No.: US 7,910,955 B2
(45) Date of Patent: Mar. 22, 2011

(54) SEMICONDUCTOR DEVICE HAVING MIS STRUCTURE AND ITS MANUFACTURE METHOD

(75) Inventors: Akira Endoh, Kawasaki (JP); Yoshimi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 11/826,593

(22) Filed: Jul. 17, 2007

(65) Prior Publication Data

US 2007/0267655 A1 Nov. 22, 2007

Related U.S. Application Data

(63) Continuation of application No. PCT/JP2005/016340, filed on Sep. 6, 2005.

(30) Foreign Application Priority Data

Jan. 25, 2005 (JP) .................................. 2005-016335

(51) Int. Cl.
*H01L 29/66* (2006.01)

(52) U.S. Cl. ............................ 257/194; 257/E29.246

(58) Field of Classification Search .................. 257/192, 257/194, E29.246, E29.248, E29.249, E29.253
See application file for complete search history.

(56) References Cited

U.S. PATENT DOCUMENTS

| | | | | |
|---|---|---|---|---|
| 6,051,454 | A * | 4/2000 | Anda et al. ...................... | 438/167 |
| 6,483,135 | B1 * | 11/2002 | Mizuta et al. ................... | 257/283 |
| 6,627,473 | B1 * | 9/2003 | Oikawa et al. .................. | 438/46 |
| 6,867,078 | B1 * | 3/2005 | Green et al. .................... | 438/167 |
| 7,041,541 | B2 * | 5/2006 | Behammer ..................... | 438/182 |
| 7,045,404 | B2 * | 5/2006 | Sheppard et al. .............. | 438/191 |
| 7,229,903 | B2 * | 6/2007 | Li et al. ........................... | 438/571 |
| 7,238,560 | B2 * | 7/2007 | Sheppard et al. .............. | 438/172 |
| 7,432,563 | B2 * | 10/2008 | Behammer ..................... | 257/401 |

(Continued)

FOREIGN PATENT DOCUMENTS

JP 4-340231 11/1992

(Continued)

OTHER PUBLICATIONS

E.M. Chumbes, et al.; "Microwave Performance of AlGaN/GaN Metal Insulator Semiconductor Field Effect Transistors on Sapphire Substrates;" *IEEE Transactions on Electron Devices*; vol. 48; No. 3; Mar. 2001; pp. 416-419 (2 Sheets).

(Continued)

*Primary Examiner* — Minh-Loan T Tran
*Assistant Examiner* — Vongsavanh Sengdara
(74) *Attorney, Agent, or Firm* — Kratz, Quintos & Hanson, LLP

(57) ABSTRACT

A channel layer (11) made of compound semiconductor and a barrier layer (12) made of compound semiconductor having a band gap wider than the channel layer are formed over a substrate. A gate insulating film (13) made of first insulating material is formed on the barrier layer over the channel region. A gate electrode (23) is formed on a partial area of the gate insulating film. A protective film is disposed on the gate insulating film on both sides of the gate electrode. The protective film comprises a lower protective film (14) made of second insulating material whose etching resistance is different from the first insulating material and an upper protective film (15) made of third insulating film whose etching resistance is different from the second insulating material. A source electrode and a drain electrode are electrically connected to the channel layer on both sides of the gate electrode.

4 Claims, 17 Drawing Sheets

U.S. PATENT DOCUMENTS

| | | | |
|---|---|---|---|
| 7,501,669 B2 * | 3/2009 | Parikh et al. | 257/194 |
| 2001/0017370 A1 * | 8/2001 | Sheppard et al. | 257/24 |
| 2002/0005528 A1 * | 1/2002 | Nagahara | 257/189 |
| 2003/0087496 A1 * | 5/2003 | Beasom | 438/304 |
| 2004/0124435 A1 * | 7/2004 | D'Evelyn et al. | 257/103 |
| 2005/0145883 A1 * | 7/2005 | Beach et al. | 257/194 |
| 2005/0170574 A1 * | 8/2005 | Sheppard et al. | 438/172 |
| 2006/0019435 A1 * | 1/2006 | Sheppard et al. | 438/167 |
| 2006/0102929 A1 * | 5/2006 | Okamoto et al. | 257/189 |
| 2006/0202272 A1 * | 9/2006 | Wu et al. | 257/355 |
| 2007/0018199 A1 * | 1/2007 | Sheppard et al. | 257/200 |
| 2007/0164321 A1 * | 7/2007 | Sheppard et al. | 257/256 |
| 2007/0164322 A1 * | 7/2007 | Smith et al. | 257/256 |

FOREIGN PATENT DOCUMENTS

| | | | |
|---|---|---|---|
| JP | 04-340231 | * | 11/1992 |
| JP | 06/120253 | | 4/1994 |
| JP | 6-177163 | | 6/1994 |
| JP | 7-183315 | | 7/1995 |
| JP | 09-092816 | | 4/1997 |
| WO | WO 2004/055905 A1 | | 7/2004 |

OTHER PUBLICATIONS

V. Adivarahan, et al.; "Submicron Gate $Si_3N_4$/AlGaN/GaN-Metal-Insulator-Semiconductor Heterostructure Field-Effect Transistors;" *IEEE Electron Device Letters*; No. 24; No. 9; Sep. 2003; pp. 541-543 (2 Sheets).

M. Ochiai, et al; "AlGaN/GaN Heterostructure Metal-Insulator-Semiconductor High-Electron-Mobility Transistors with $Si_3N_4$ Gate Insulator;" *Jpn. J. Appl. Phys.*; vol. 42; Part 1; No. 4B; Apr. 2003; pp. 2278-2280 (2 Sheets).

Supplementary European Search Report dated Jun. 15, 2009.

Office Action dated Feb. 1, 2011 corresponding to Japanese Patent Application No. 2007-500417 with English translation.

* cited by examiner

SEMICONDUCTOR DEVICE HAVING MIS STRUCTURE AND ITS MANUFACTURE METHOD

This application is a continuation of international application PCT/JP05/016340 filed Sep. 6, 2005.

TECHNICAL FIELD

The present invention relates to a semiconductor device having a MIS structure and its manufacture method, and more particularly to a semiconductor device applicable to a high electron mobility transistor (HEMT) which is a high frequency device particularly used for communications and its manufacture method.

BACKGROUND ART

Research and development about a GaN based HEMT has been conducted mainly as transistors capable of high power and high voltage operations. In addition, it has been theoretically predicted that the GaN based HEMT holds the potential that the operation speed can be higher. The most straightforward approach to make higher the operation speed of an FET such as HEMT is to shorten a gate length.

From the viewpoint of scaling rules of HEMT, as the gate length is shortened, a gate-channel distance is required to be shortened. However, as the gate-channel distance is shortened, a problem of an increase in gate leakage current is likely to occur. In order to avoid an increase in gate leakage current, it is effective to replace Schottky contact with a Metal Insulator Semiconductor (MIS) structure having a gate insulating film inserted between a gate electrode and a semiconductor layer.

Silicon nitride (SiN) is known as typical gate insulating film material to be used for MIS type GaN based HEMT. When the scaling rules are taken into consideration, even if a gate insulating film of SiN is inserted, it is preferable to make the gate-channel distance as short as possible. Methods have been adopted to shorten the gate-channel distance, including a method of forming a recess in a gate insulating film and making a gate electrode in contact with the bottom of the recess, a method of thinning a gate insulating film as much as possible, and the like.

For example, a technique of forming a recess in a gate insulating film is disclosed in the following document 1, and a technique of making a gate insulating film itself as thin as possible is disclosed in the following documents 2 and 3.

Document 1: E. M. Chumbes et al., IEEE TRANSACTIONS ON ELECTRON DEVICES, Vol. 48, No. 3, pp. 416-419 (2001)

Document 2: V. Adivarahan et al., IEEE ELECTRON DEVICE LETTERS, Vol. 24, No. 9, pp. 541-543 (2003)

Document 3: M. Ochiai et al., Jpn. J. Appl. Phs., Vol. 42, pp. 2278-2280 (2003)

PROBLEMS TO BE SOLVED BY THE INVENTION

FIG. 14 is a cross sectional view showing the main part of a conventional MIS type GaN based HEMT. On a substrate 1 made of sapphire or silicon carbide, a channel layer (electron transit layer) 2 made of GaN and a barrier layer (electron supply layer) 3 made of AlGaN are stacked in this order.

A source electrode 5 and a drain electrode 6 are formed on the barrier layer 3, and a space is kept between the source electrode 5 and the drain electrode 6. A gate insulating film 4 made of SiN is formed on the barrier layer 3 between the source electrode 5 and drain electrode 6. A recess 4C is formed in a partial region of the gate insulating film 4, and a lower portion of the gate electrode 7 fills the recess 4C.

With reference to FIGS. 15A to 15C, description will be made on a method for manufacturing the gate structure of HEMT shown in FIG. 14.

As shown in FIG. 15A, on the electron supply layer 3, the gate insulating film 4 of SiN is formed. On the gate insulating film 4, a resist film 19 is formed and an opening 19A corresponding to a gate electrode is formed through the resist film 19.

As shown in FIG. 15B, by using the resist film 19 as an etching mask, the gate insulating film 4 is dry etched partway in a thickness direction to form the recess 4C. The regions of the gate insulating film 4 and electron supply layer 3 under the recess 4C are damaged during this dry etching.

As shown in FIG. 15C, the gate electrode 7 is formed in such a manner that a lower portion of the gate electrode 7 fills the recess 4C formed in the gate insulating film 4. After the gate electrode 7 is formed, the resist film 19 shown in FIG. 15B is removed. Damages introduced into the gate insulating film 4 and underlying barrier layer 3 may cause a problem of increasing gate leakage current. As the barrier layer 3 is damaged, other electric characteristics may be deteriorated.

FIG. 16 is a cross sectional view showing the main part of another conventional MIS type GaN based HEMT. Each constituent element of HEMT shown in FIG. 16 is represented by the identical reference symbol to that of a corresponding constituent element of HEMT shown in FIG. 14. In HEMT shown in FIG. 16, instead of forming the recess in the insulating film 4, a gate insulating film 4A itself is thinned.

With reference to FIGS. 17A and 17B, description will be made on a method for manufacturing the gate structure of HEMT shown in FIG. 16.

As shown in FIG. 17A, on the electron supply layer 3, a gate insulating film 4A made of SiN is formed. On the gate insulating film 4A, a resist film 19 is formed, and an opening 19A corresponding to a gate electrode is formed through the resist film 19.

As shown in FIG. 17B, the gate electrode 7 is formed in such a manner that a portion of the gate electrode 7 fills the opening 19A. After the gate electrode 7 is formed, the resist film 19 shown in FIG. 17A is removed.

In the method shown in FIGS. 17A and 17B, since a recess is not formed in the gate insulating film 4A, the gate insulating film 4A and barrier layer 3 are not damaged. In order to lower an electric resistance of a gate electrode of HEMT having a micro gate electrode, a T shaped gate structure having a cross section of a T-character shape is often adopted. In the structure shown in FIG. 14, a sufficient mechanical strength of the gate electrode 7 can be retained because the lower portion of the gate electrode 7 fills the recess 4C. However, in the structure shown in FIG. 16, a sufficient mechanical strength of the gate electrode cannot be obtained because the gate electrode 7 is in contact with a flat surface.

It is an object of the present invention to provide a semiconductor device having a gate structure capable of obtaining a sufficient mechanical strength of a gate electrode without damaging a gate insulating film, and its manufacture method.

MEANS FOR SOLVING THE PROBLEMS

According to one aspect of the present invention, there is provided a semiconductor device comprising:

a channel layer formed over a substrate and made of compound semiconductor;

a barrier layer formed on the channel layer and made of compound semiconductor having a band gap wider than a band gap of the channel layer;

a gate insulating film disposed on the barrier layer over a channel region and made of first insulating material;

a gate electrode disposed on a partial area of the gate insulating film;

a protective film disposed on the gate insulating film on both sides of the gate electrode and comprising a lower protective film made of second insulating material whose etching resistance is different from an etching resistance of the first insulating material and an upper protective film made of third insulating film whose etching resistance is different from an etching resistance of the second insulating material; and a source electrode and a drain electrode electrically connected to the channel layer on both sides of the gate electrode.

According to another aspect of the present invention, there is provided a method for manufacturing a semiconductor device comprising steps of:

(a) forming a channel layer made of compound semiconductor over a substrate;

(b) forming a barrier layer on the channel layer, the barrier layer being made of compound semiconductor having a band gap wider than a band gap of the channel layer;

(c) forming a gate insulating film on the barrier layer, the gate insulating film being made of first insulating material;

(d) forming a lower protective film on the gate insulating film, the lower protective film being made of second insulating material different from the first insulating material;

(e) forming an upper protective film on the lower protective film, the upper protective film being made of third insulating material different from the second insulating material;

(f) forming a mask pattern on the upper protective film, the mask pattern having an opening at a position corresponding to a position where a gate electrode is to be disposed;

(g) by using the mask pattern as an etching mask, dry-etching the upper protective film;

(h) wet-etching the lower protective film via an etched region of the upper protective film to partially expose the gate insulating film; and (i) forming a gate electrode on an exposed area of the gate insulating film.

ADVANTAGES OF THE INVENTION

Since the gate electrode is supported by the lower protective film and upper protective film, it is possible to retain a sufficient mechanical strength of the gate electrode. Since lower protective film is wet etched, it is possible to suppress damages to be introduced into the gate insulating film under the gate electrode.

BEST MODE FOR CARRYING OUT THE INVENTION

Figure 1:
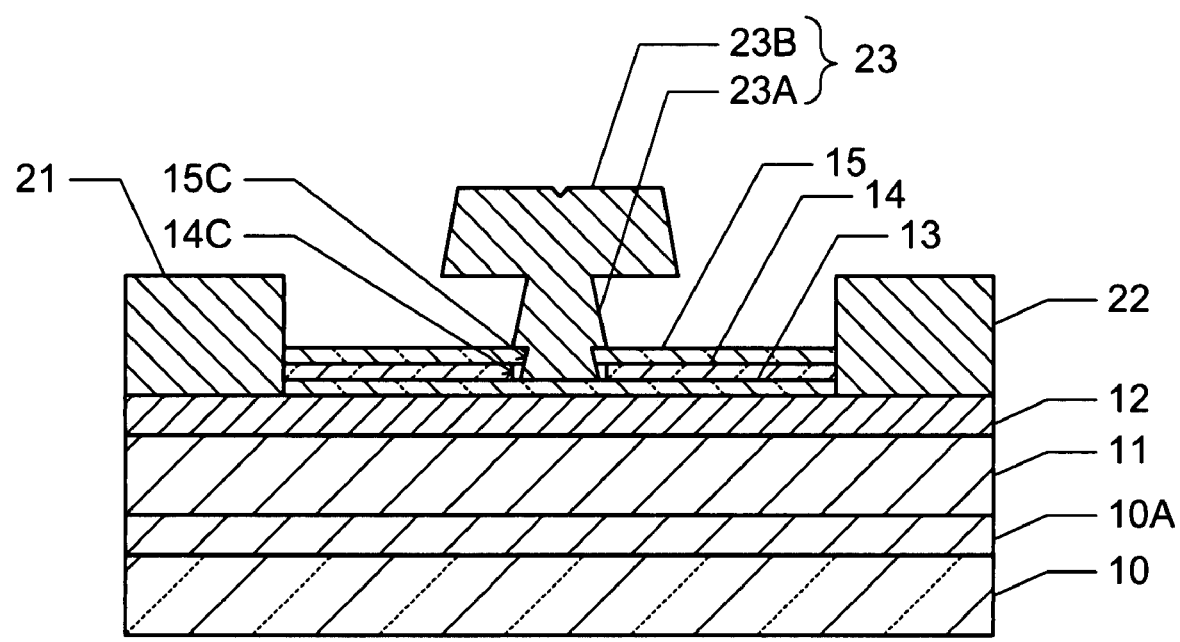
FIG. 1 is a cross sectional view of a semiconductor device according to an embodiment.

FIG. 1 is a cross sectional view of a semiconductor device according to an embodiment. On a substrate 10 made of sapphire ($Al_2O_3$) or silicon carbide (SiC), a buffer layer 10A made of undoped GaN is formed. On the buffer layer 10A, a channel layer (electron transit layer) 11 made of undoped GaN and a barrier layer (electron supply layer) 12 made of undoped or n-type impurity doped AlGaN are stacked in this order.

A source electrode 21 and a drain electrode 22 are formed on the barrier layer 12, keeping a distance from each other. The source electrode 21 and drain electrode 22 are electrically connected to the channel layer 11. A gate insulating film 13 made of SiN is formed on the barrier layer 12 between the source electrode 21 and drain electrode 22. On the gate insulating film 13, a lower protective film 14 made of $SiO_2$ and an upper protective film 15 made of SiN are stacked.

An opening 15C is formed through the upper protective film 15, and an opening 14C is formed through the lower protective film 14 in a region corresponding to the opening 15C. The opening 14C has a plan shape larger than that of the opening 15C. More specifically, an edge of the lower protective film 14 defining the outer periphery of the opening 14C is retreated from an edge of the upper protective film 15 defining the outer periphery of the opening 15C. The surface of the gate insulating film 13 is exposed on the bottom of the opening 14C.

A gate leg portion 23A of a gate electrode 23 is in contact with the surface of the gate insulating film 13 exposed on the bottom of the opening 14C. The gate electrode 23 extends upward higher than the upper surface of the upper protective film 15 via the openings 14C and 15C. An umbrella portion 23B protruding laterally in a eaves shape is continuous with the upper end of the gate leg portion 23A. The gate electrode 23 having a T-character cross section is constituted of the gate leg portion 23A and umbrella portion 23B.

With reference to FIGS. 2 to 10, description will be made on a method for manufacturing the semiconductor device of the embodiment.

Figure 2:
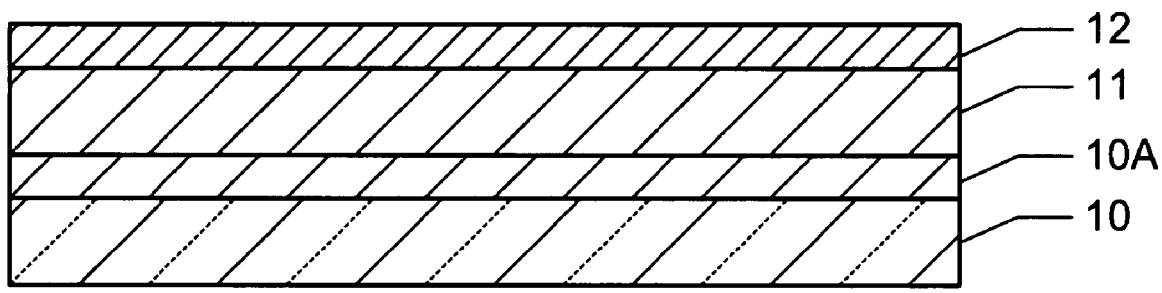
FIG. 2 is a cross sectional view (first) of the semiconductor device of the embodiment during manufacture for illustrating a manufacture method for the device.

As shown in FIG. 2, on a substrate 10 made of sapphire or silicon carbide, a buffer layer 10A made of undoped GaN is formed by metal organic chemical vapor deposition (MOCVD) or molecular beam epitaxy (MBE). On the buffer layer 10A, a channel layer 11 is formed which is made of undoped GaN and has a thickness of about 3000 nm. On the channel layer 11, a barrier layer 12 is formed which is made of undoped or n-type impurity doped AlGaN and has a thickness of about 20 nm. An AlN composition ratio of the barrier layer 12 is 25%. The channel layer 11 and barrier layer 12 may be formed by MOCVD or MBE. After the barrier layer 12 is formed, an isolation process is executed.

Figure 3:
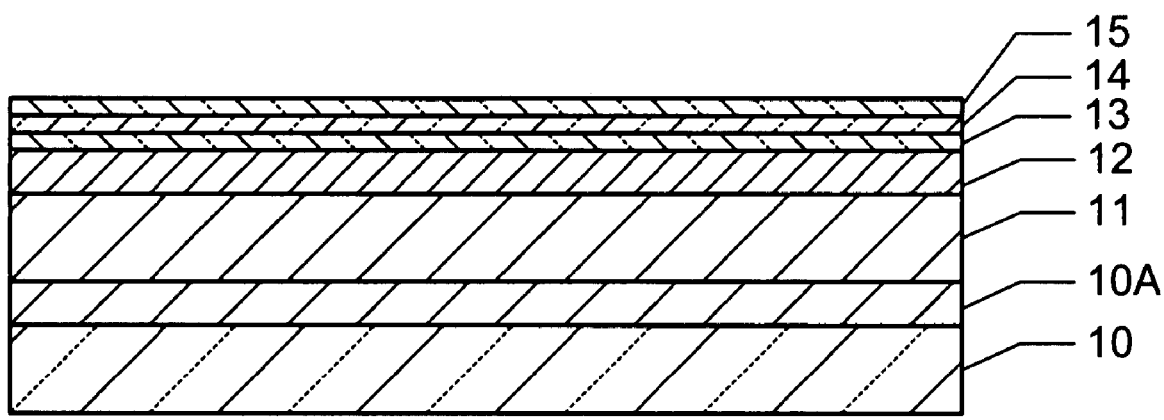
FIG. 3 is a cross sectional view (second) of the semiconductor device of the embodiment during manufacture for illustrating a manufacture method for the device.

As shown in FIG. 3, sequentially formed on the barrier layer 12 are a gate insulating film 13 made of SiN and having a thickness of about 5 nm, a lower protective film 14 made of $SiO_2$ and having a thickness of about 30 nm and an upper protective film 15 made of SiN and having a thickness of about 30 nm. These three layers may be formed, for example, by plasma enhanced chemical vapor deposition (PE-CVD).

Figure 4:
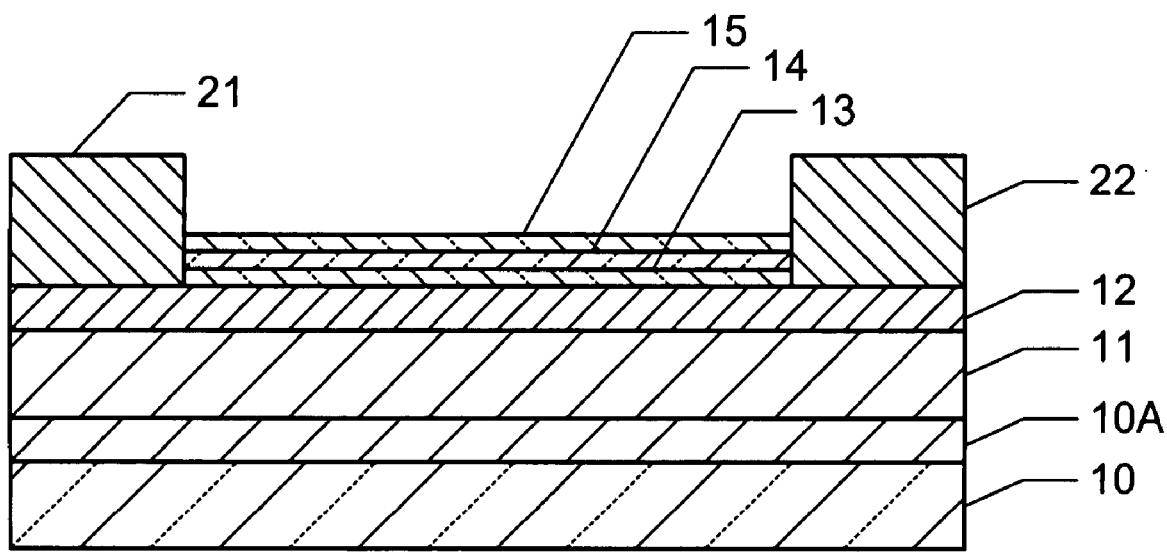
FIG. 4 is a cross sectional view (third) of the semiconductor device of the embodiment during manufacture for illustrating a manufacture method for the device.

As shown in FIG. 4, a source electrode 21 and a drain electrode 22 are formed on the barrier layer 12. Description will be made hereunder on a method of forming the source electrode 21 and drain electrode 22.

The upper protective film 15 is covered with a resist pattern having openings having shapes corresponding to those of the source electrode 21 and drain electrode 22. By using the resist pattern as an etching mask, three layers, the gate insulating film 13, lower protective film 14 and upper protective film 15, are etched. A Ti film, an Al film, a Ti film and an Au film are deposited in this order on the whole substrate surface. The resist pattern used as the etching mask when the openings were formed is removed together with the Ti film, Al film, Ti film and Au film deposited on the resist pattern. The source electrode 21 and drain electrode 22 of a four-layer structure therefore remain in the openings. Annealing is performed at a temperature of about 800° C. to form ohmic contacts between the channel layer 11 and each of the source electrode 21 and drain electrode 22.

Figure 5:
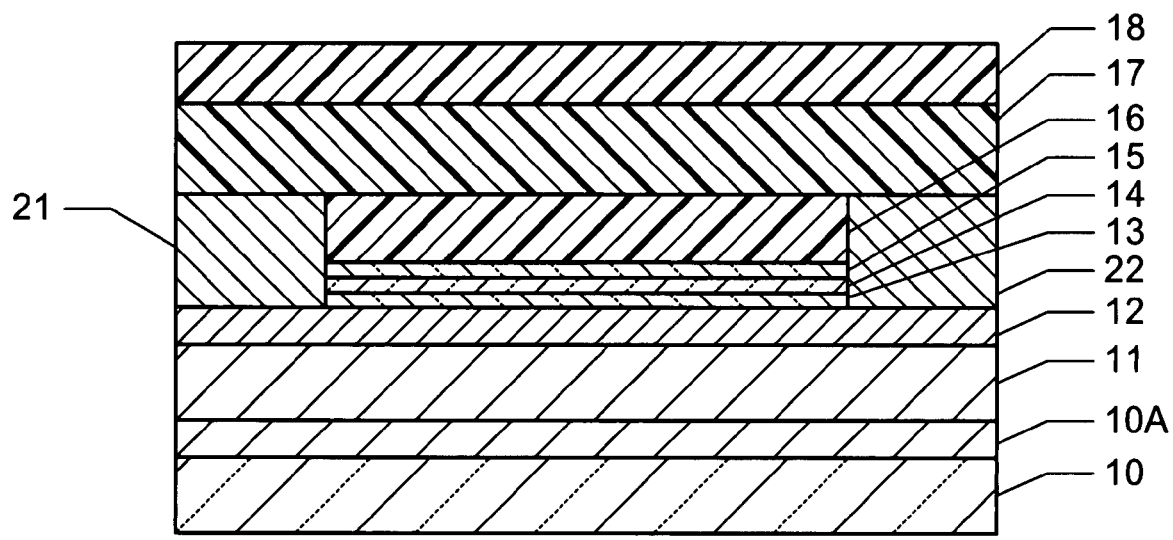
FIG. 5 is a cross sectional view (fourth) of the semiconductor device of the embodiment during manufacture for illustrating a manufacture method for the device.

As shown in FIG. 5, on the upper protective film 15, a first resist film 16 is formed. A thickness of the first resist film 16 is set in such a manner that the upper surface of the first resist film is approximately flush with the upper surfaces of the source electrode 21 and drain electrode 22. A second resist film 17 is formed covering the first resist film 16, source electrode 21 and drain electrode 22. A third resist film 18 is formed on the second resist film 17.

The second resist film 17 has exposure and development characteristics different from those of the first resist film 16 and third resist film 18. For example, ZEP resist manufactured by ZEON Corporation can be used as the first and third resist films 16 and 18, and polydimethylglutarimide (PMGI) resin manufactured by MicroChem Corp can be used as the second resist film 17.

Figure 6:
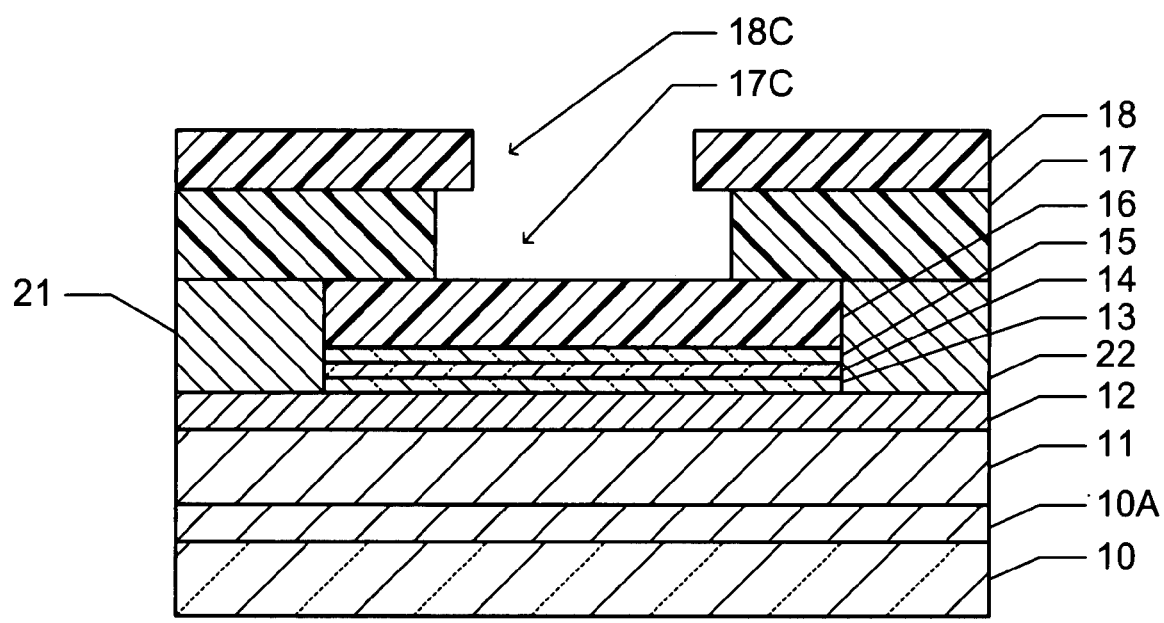
FIG. 6 is a cross sectional view (fifth) of the semiconductor device of the embodiment during manufacture for illustrating a manufacture method for the device.

As shown in FIG. 6, openings 18C and 17C are formed through the third resist film 18 and second resist film 17, respectively, by using an electron beam exposure method. The opening 18C is approximately in conformity with the plan shape of the umbrella portion 23B of the gate electrode 23 shown in FIG. 1. An edge of the second resist film 17 defining the outer periphery of the opening 17C is slightly retreated from an edge of the third resist film 18 defining the outer periphery of the opening 18C.

Figure 7:
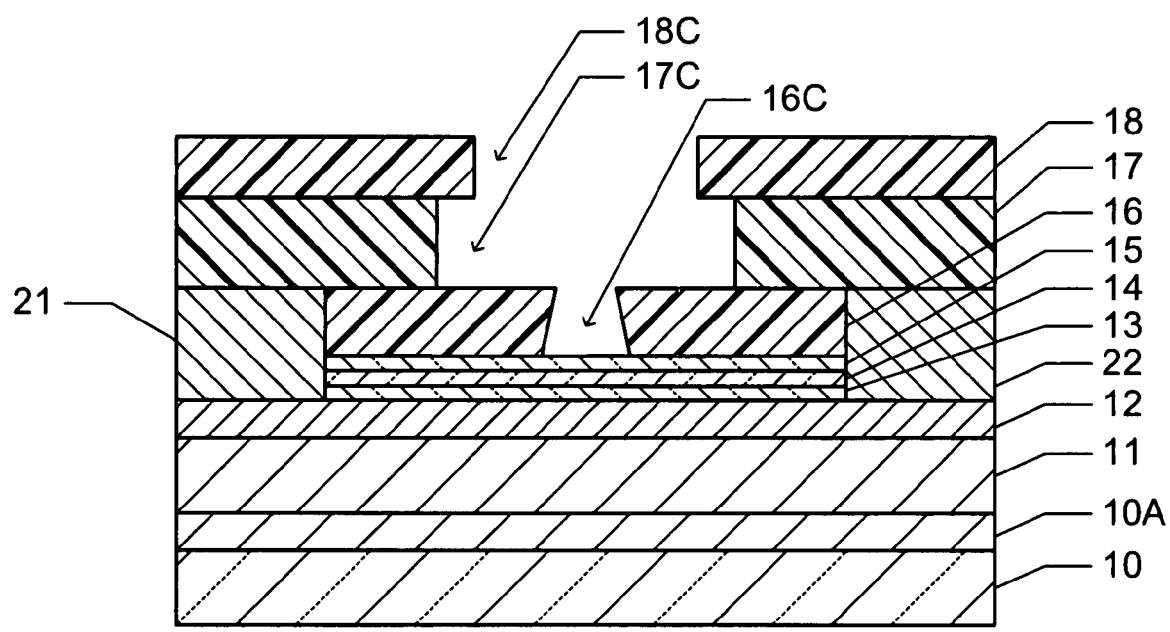
FIG. 7 is a cross sectional view (sixth) of the semiconductor device of the embodiment during manufacture for illustrating a manufacture method for the device.

As shown in FIG. 7, an opening 16C is formed through the first resist film 16 exposed on the bottom of the opening 17C by an electron beam exposure method. The shape and size of the opening 16C are determined based on the gate length and width.

Figure 8:
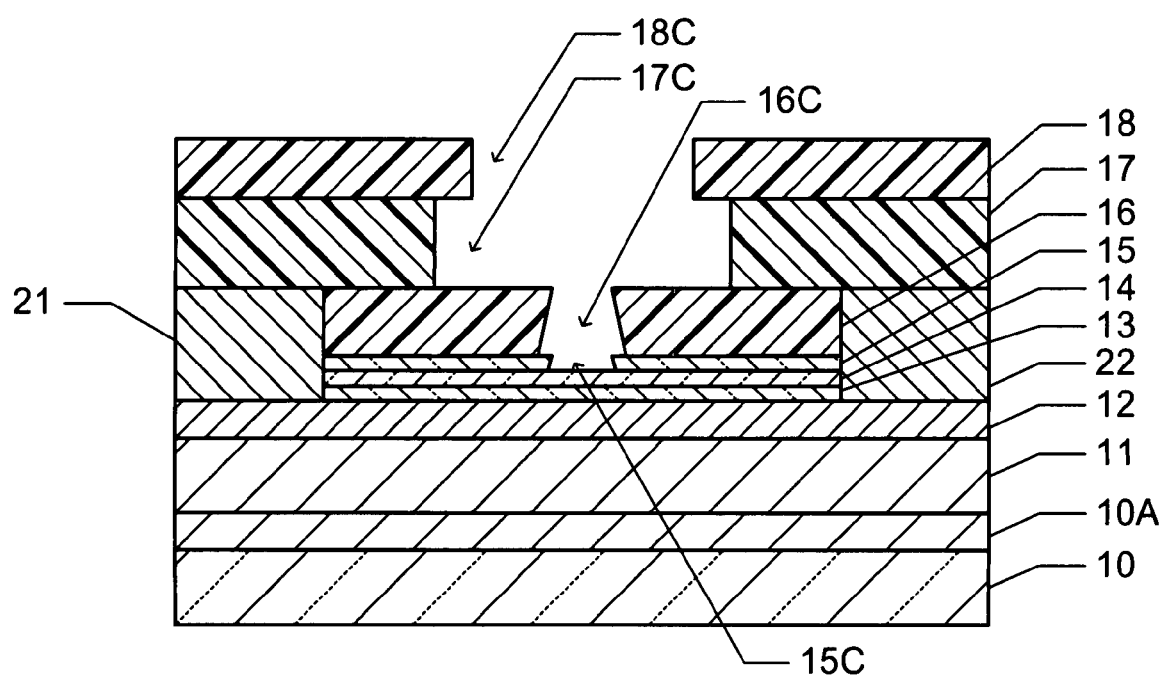
FIG. 8 is a cross sectional view (seventh) of the semiconductor device of the embodiment during manufacture for illustrating a manufacture method for the device.

As shown in FIG. 8, by using the first etching film 16 as an etching mask, the upper protective film 15 is etched to form an opening 15C. In etching the upper protective film 15 made of SiN, reactive ion etching using, for example, $CF_4$ as etching gas may be used. Etching is performed until the lower protective film 14 made of $SiO_2$ is exposed.

Figure 9:
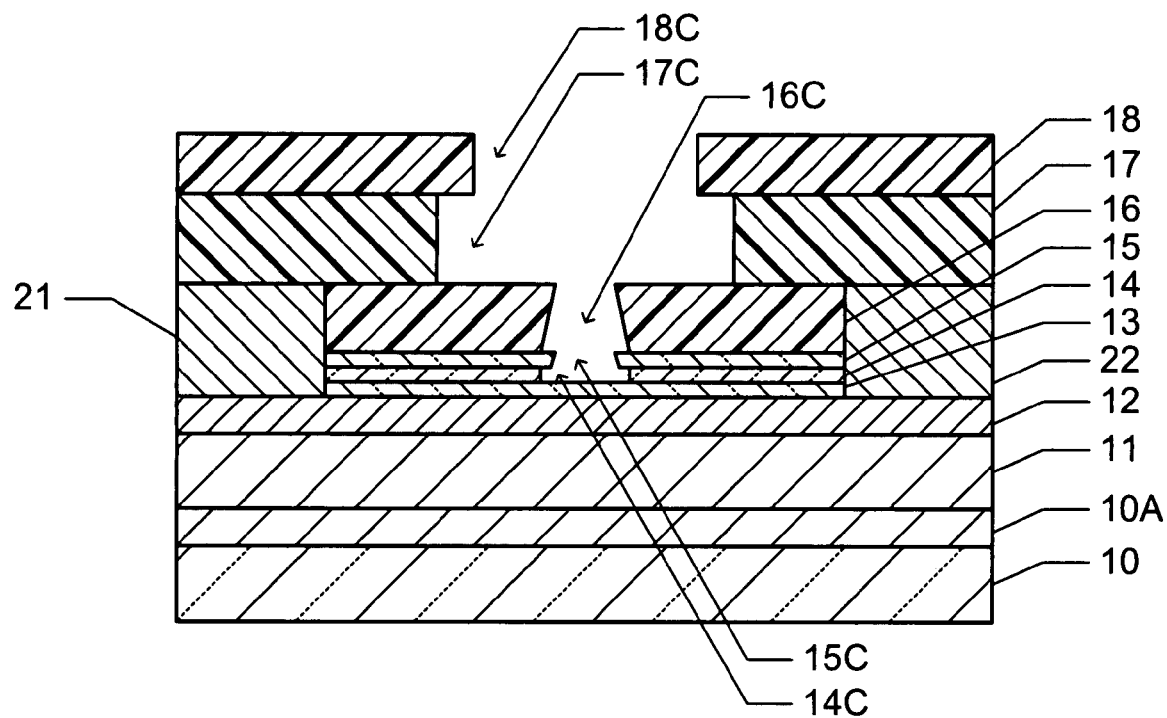
FIG. 9 is a cross sectional view (eighth) of the semiconductor device of the embodiment during manufacture for illustrating a manufacture method for the device.

As shown in FIG. 9, by using the upper protective film 15 as an etching mask, the lower protective film 14 is etched to form an opening 14C. In etching the lower protective film 14, wet etching using, for example, hydrofluoric acid as etchant may be used. Since etching progresses isotropically, the lower protective film 14 is etched also in a lateral direction.

A portion damaged when the upper protective film 15 was dry etched is removed by wet etching. Namely, the lower protective film 14 has a role of absorbing damages. Since the opening 14C is formed by wet etching, the gate insulating film 13 exposed on the bottom of the opening 14C is damaged scarcely as compared to the case where the opening 14C is formed by dry etching. It is also possible to retain flatness of the upper surface of the gate insulating film 13 exposed on the bottom of the opening 14C.

Figure 10:
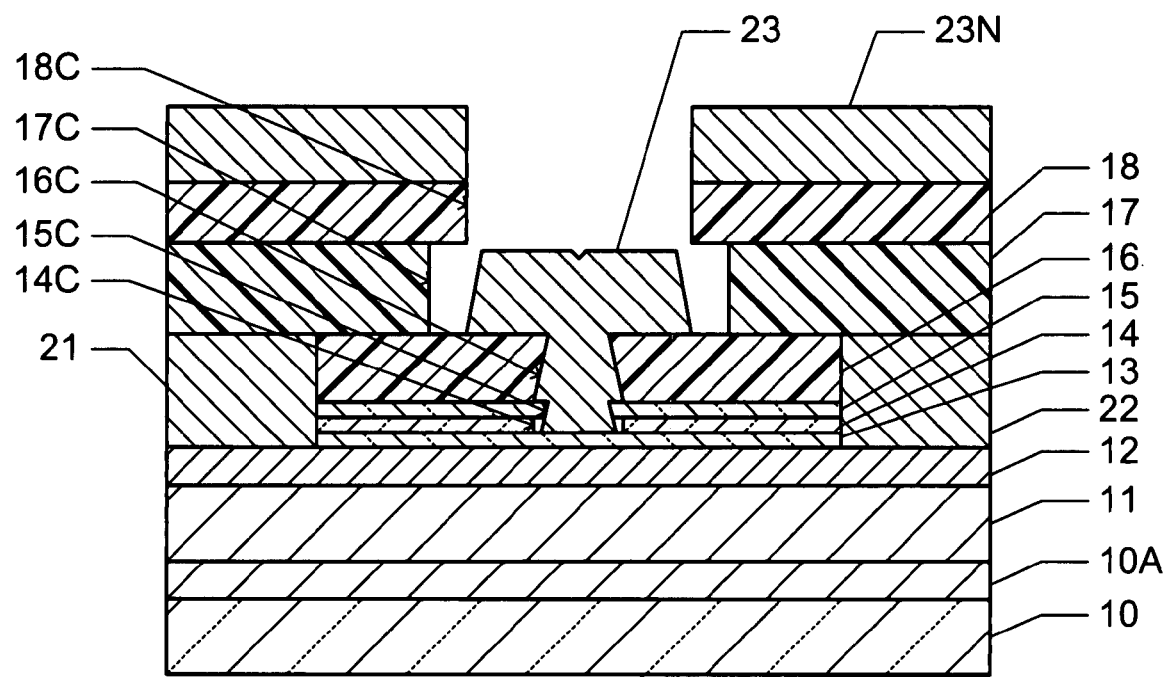
FIG. 10 is a cross sectional view (ninth) of the semiconductor device of the embodiment during manufacture for illustrating a manufacture method for the device.

As shown in FIG. 10, a Ni film and an Au film are sequentially deposited on the substrate surface. Thicknesses of the Ni film and Au film are, e.g., 3 to 7 nm and 300 to 400 nm, respectively. The Ni film and Au film deposited in the openings 14C, 15C, 16C and 17C constitute a gate electrode 23. Two layers 23N, the Ni film and Au film, are deposited also on the third resist film 18.

The semiconductor device shown in FIG. 1 is completed by dissolving and stripping the first resist film 16, second resist film 17 and third resist film 18.

In the semiconductor device of the embodiment described above, the edge of the upper protective film 15 defining the outer periphery of the opening 15C is in contact with the sidewall of the gate leg portion 23A and supports the gate leg portion 23A. It is therefore possible to prevent the gate electrode 23 from falling down and retain a sufficient mechanical strength.

In order to retain a sufficient mechanical strength of the gate electrode 23, a total thickness of the lower protective film 14 and upper protective film 15 is preferably set to at least 25% of a height of the gate electrode 23.

The gate insulating film 13 made of SiN is effective as a surface protective film. A surface energy level of the barrier layer 12 is made inactive by the gate insulating film so that current collapse often occurring in a MIS type GaN based HEMT can be suppressed.

Figure 11:
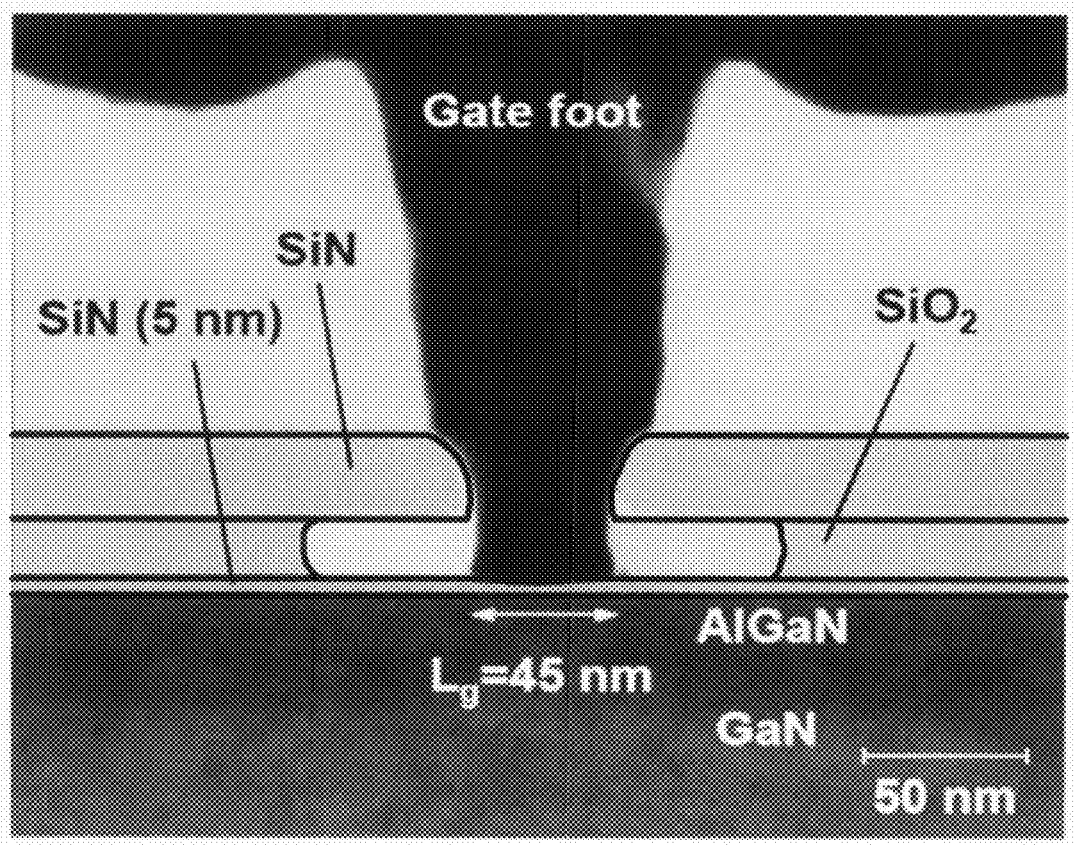
FIG. 11 is a diagram showing a transmission type microscopic photograph of a semiconductor device manufactured by an embodiment method.

FIG. 11 shows a transmission electron microscopic photograph of a MIS type GaN based HEMT manufactured by the embodiment method. In FIG. 11, border lines difficult to be distinguished in the photograph are drawn by solid lines to make easy to distinguish the border lines. A gate length Lg is 45 nm, and a thickness of the gate insulating film made of SiN is 5 nm. It is seen that the upper protective film made of SiN supports the gate leg portion.

Figure 12:
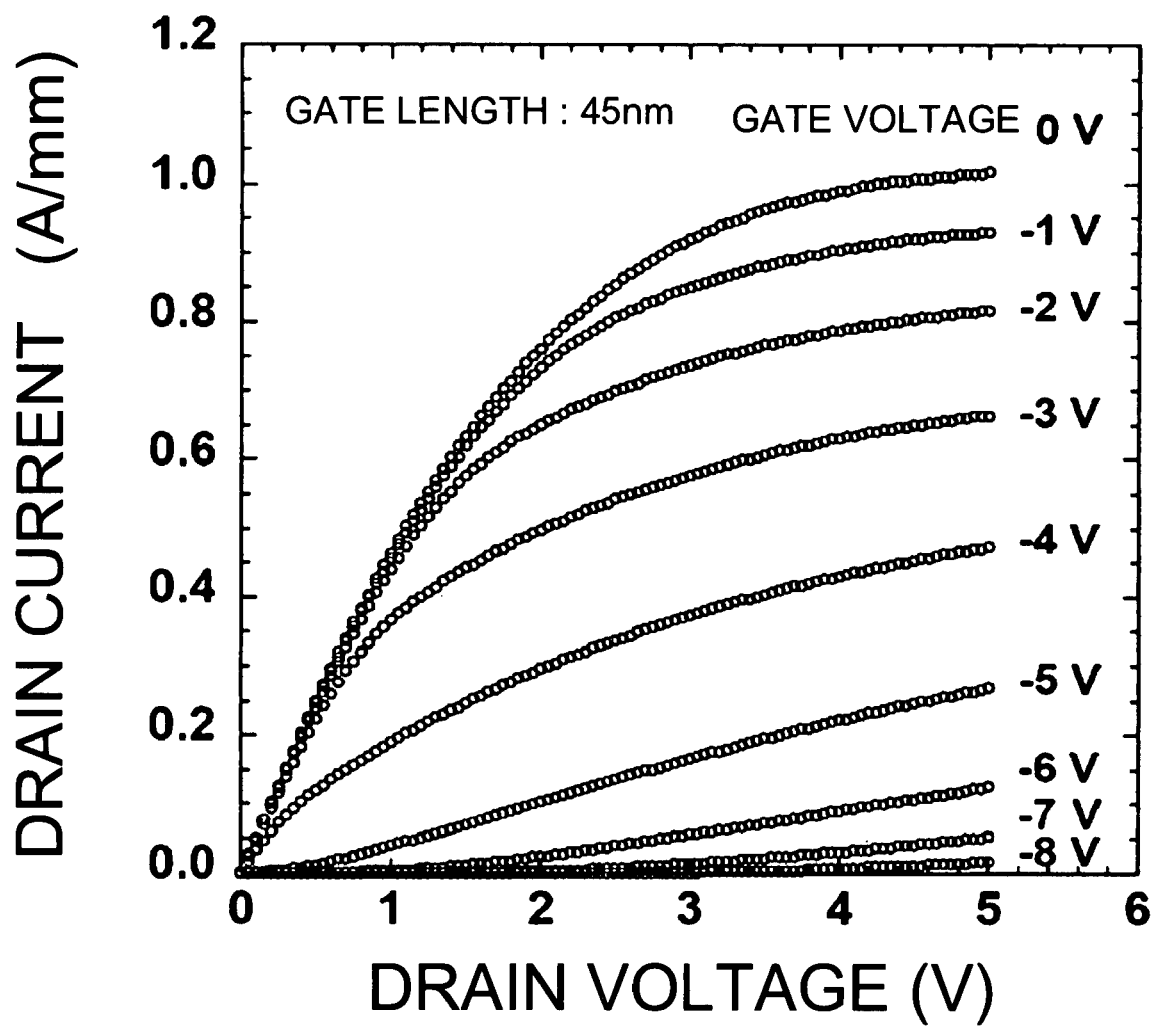
FIG. 12 is a graph showing current-voltage characteristics of the semiconductor device manufactured by the embodiment method.

FIG. 12 shows measurement results of current-voltage characteristics of HEMT shown in FIG. 11. The abscissa represents a drain voltage in the unit of "V" and the ordinate represents a drain current in the unit of "A/mm", i.e., a current value per gate width of 1 mm. It can be seen that good transistor characteristics are obtained. A maximum transconductance $gm_{max}$ at a drain voltage of 5 V was 215 mS/mm.

Figure 13:
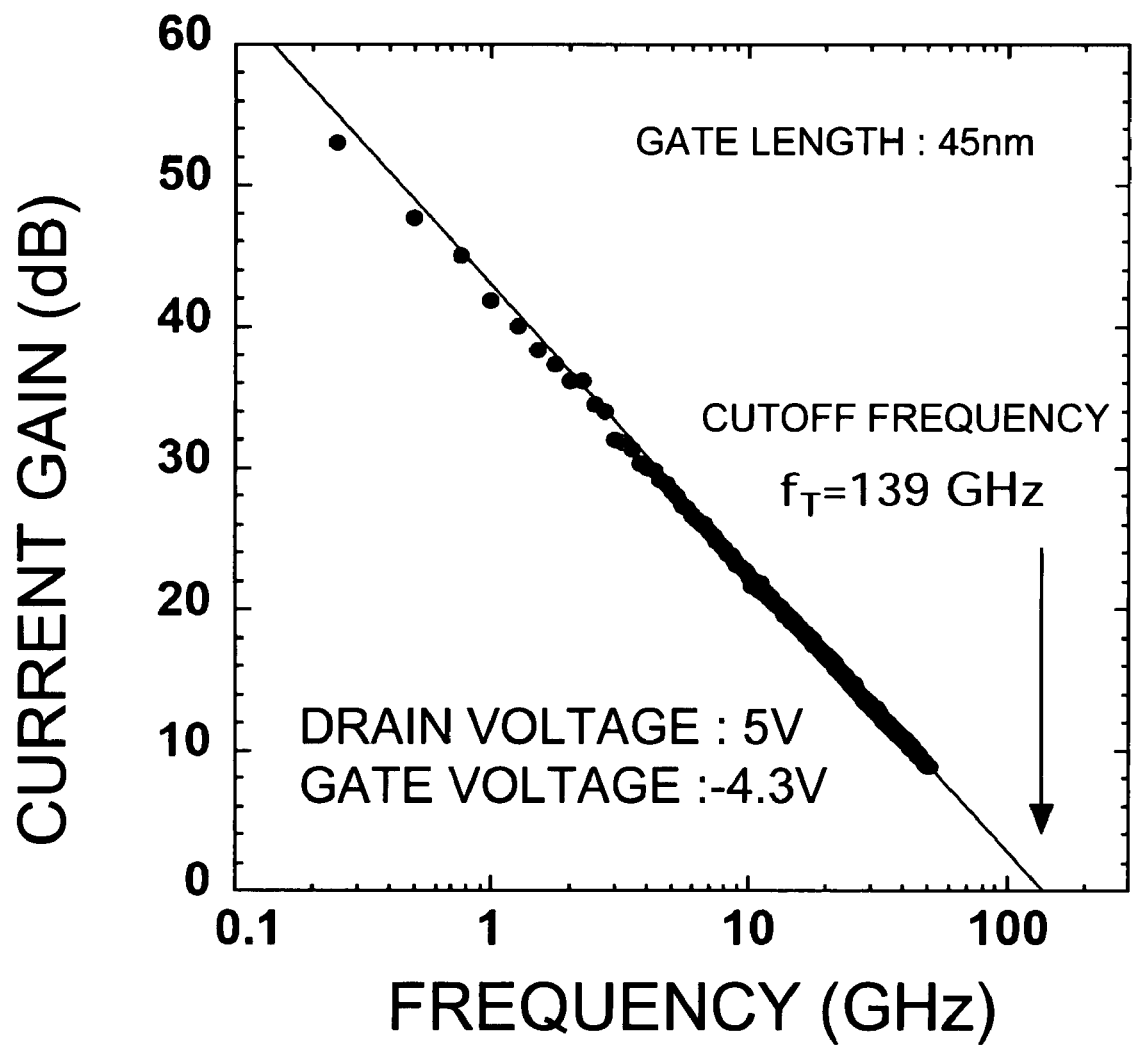
FIG. 13 is a graph showing the frequency dependency of a current gain of the semiconductor device manufactured by the embodiment method.
Figure 14:
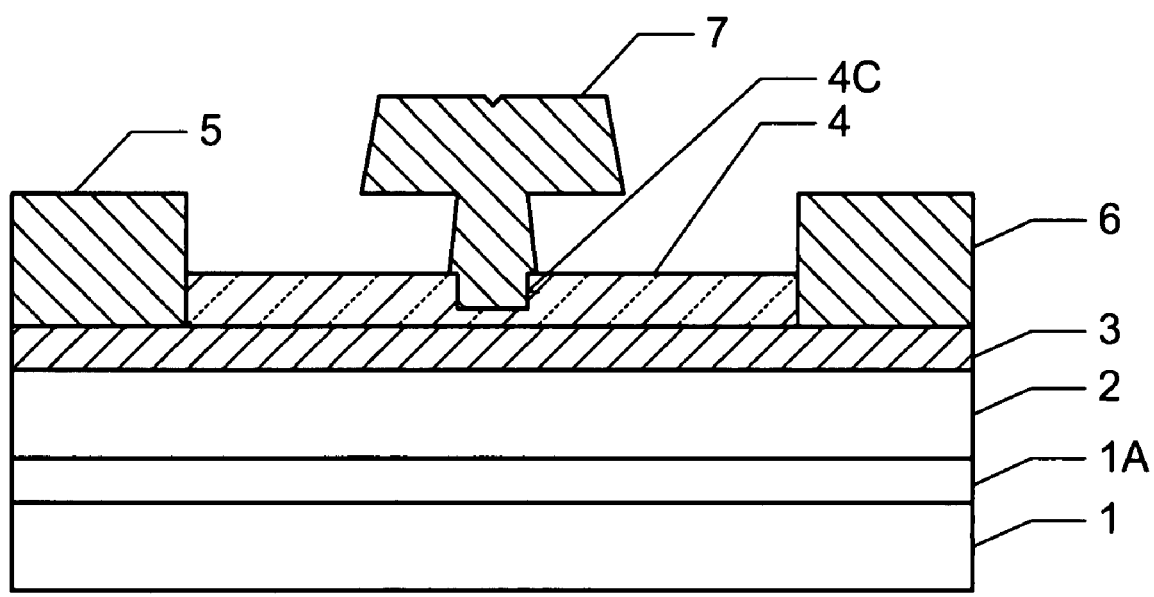
FIG. 14 is a cross sectional view of a conventional MIS type HEMT.
Figure 15A:
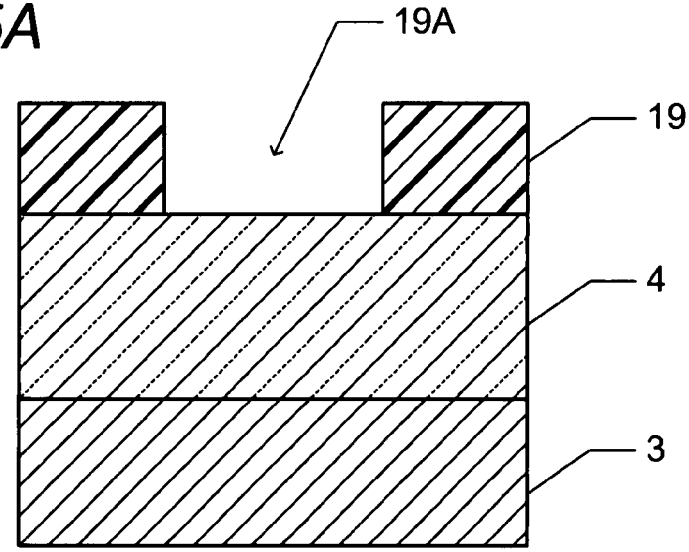
FIGS. 15A to 15C are cross sectional views of HEMT shown in FIG. 14 during manufacture.
Figure 15B:
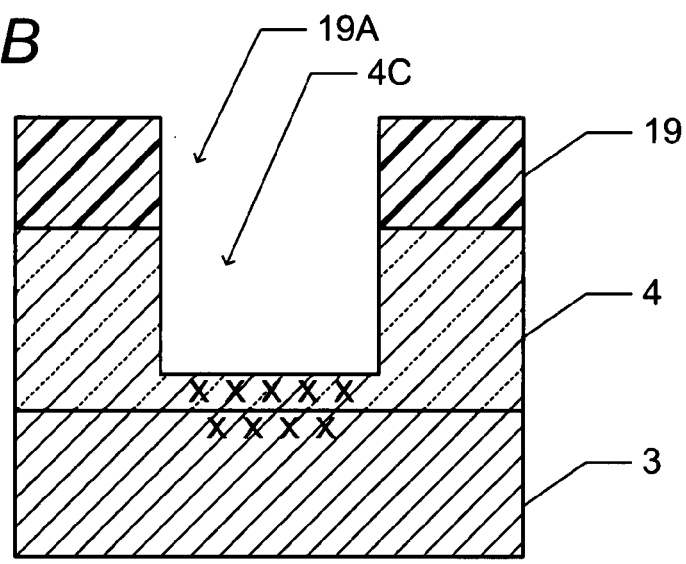
Figure 15C:
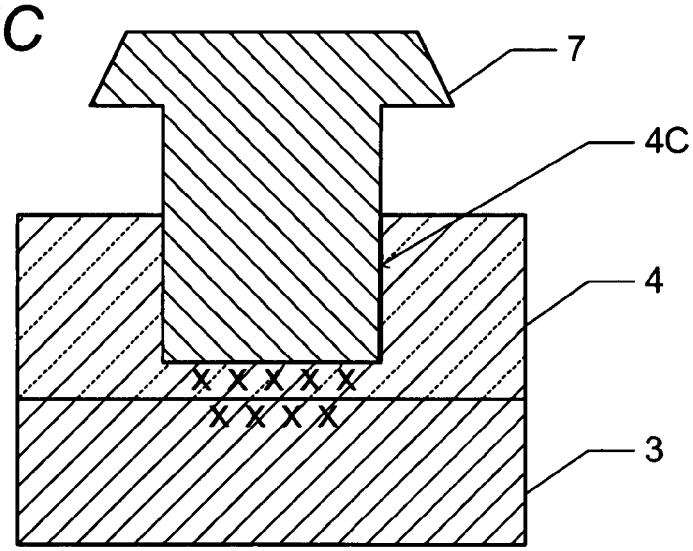
Figure 16:
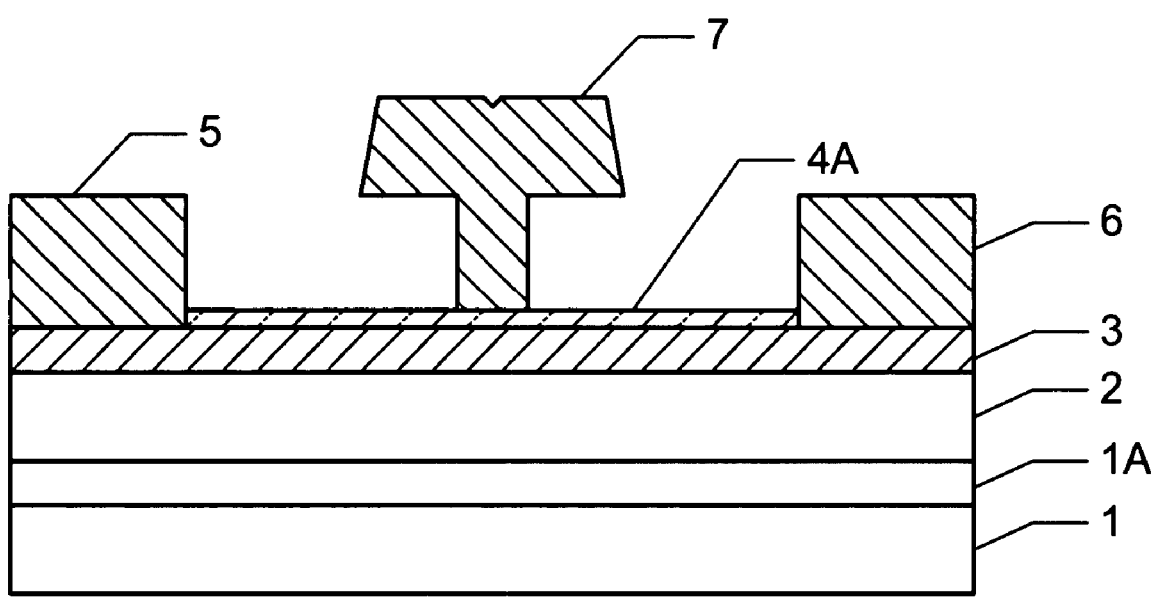
FIG. 16 is a cross sectional view of another conventional MIS type HEMT.
Figure 17A:
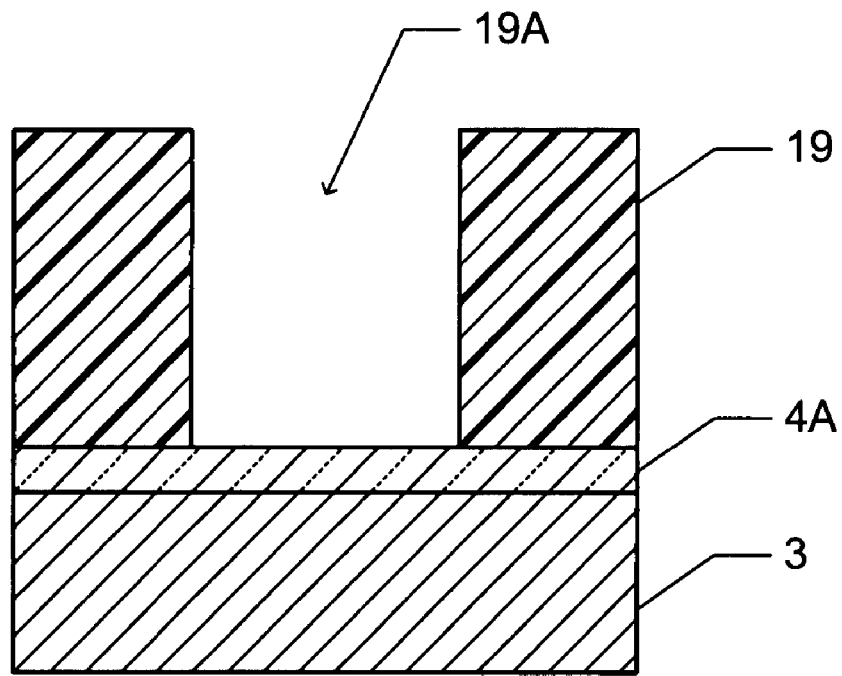
FIGS. 17A and 17B are cross sectional views of HEMT shown in FIG. 16 during manufacture.
Figure 17B:
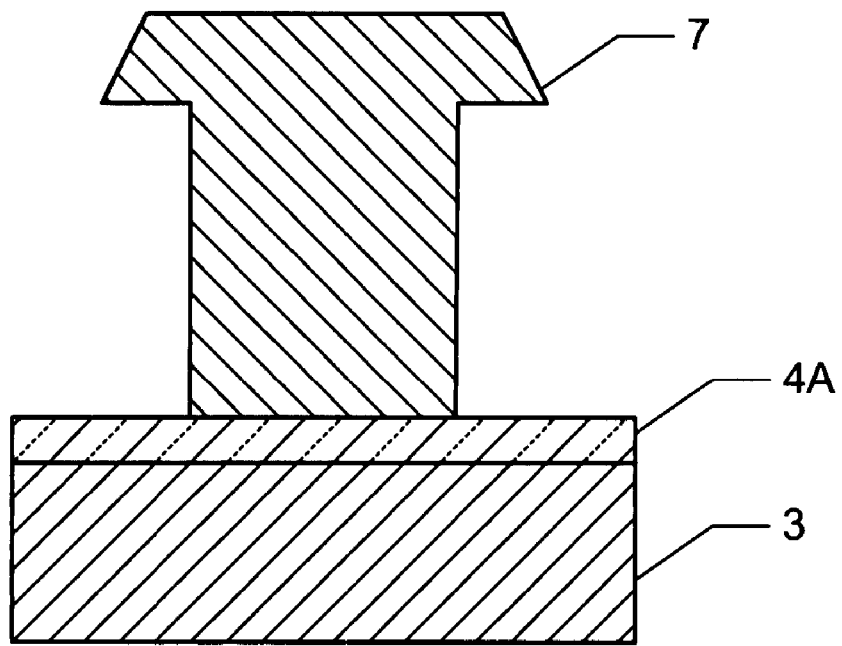

FIG. 13 shows the frequency dependency of a current gain of HEMT shown in FIG. 11. The abscissa represents a frequency in the unit of "GHz" and the ordinate represents a current gain in the unit of "dB". Measurements were conducted at a drain voltage of 5 V and a gate voltage of −4.3 V. A cutoff frequency $f_T$ was 139 GHz and good results were obtained.

In the embodiment described above, the gate insulating film 13 and upper protective film 15 are made of SiN and the lower protective film 14 is made of $SiO_2$. As materials of the gate insulating film 13, lower protective film 14 and upper protective film 15, combinations of materials meeting the requirement that the lower protective film 14 has a different etching resistance from that of both the gate insulating film 13 and upper protective film 15 may be used other than those described above. It is preferable that the lower protective film 14 in particular is made of material which can be wet etched selectively with respect to the gate insulating film 13.

For example, the gate insulating film 13 and upper protective film 15 may be made of SiN, SiON or $Al_2O_3$, and the lower protective film 14 may be made of $SiO_2$, $ZrO_2$ or $HfO_2$.

In the embodiment described above, although a GaN based HEMT is used illustratively by using the channel layer 11 made of GaN and the barrier layer made of AlGaN, the structures of the gate insulating film, lower protective film and upper protective film of the embodiment described above may be applied to HEMT made of other materials. For example, the structures are applicable also to GaAs based and InP based MIS Type HEMT's. The barrier layer is made of compound semiconductor having a wider band gap than that of the channel layer.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device comprising:
   a channel layer formed over a substrate and made of compound semiconductor;
   a barrier layer formed on the channel layer and made of compound semiconductor having a band gap wider than a band gap of the channel layer;
   a gate insulating film disposed on the barrier layer over a channel region and made of first insulating material;
   a gate electrode disposed on a partial area of the gate insulating film;
   a protective film disposed on the gate insulating film on both sides of the gate electrode and comprising a lower protective film made of second insulating material whose etching resistance is different from an etching resistance of the first insulating material and an upper protective film made of third insulating film whose etching resistance is different from an etching resistance of the second insulating material; and
   a source electrode and a drain electrode electrically connected to the channel layer on both sides of the gate electrode,
   wherein the gate electrode comprises a leg portion and an umbrella portion, the leg portion disposed on the gate insulating film and in contact with the gate insulating film and extending upward higher than an upper surface of the upper protective film, the umbrella portion protruding laterally in an eaves shape and being continuous with an upper end of the leg portion, the umbrella portion extending above the upper protective film without being in contact with the upper protective film, and
   wherein an edge of the upper protective film on a side of the leg portion is in contact with a sidewall of the leg portion, and an edge of the lower protective film on a side of the leg portion retreats from the sidewall of the leg portion.

2. The semiconductor device according to claim 1, wherein the first and third insulating materials are SiN, SiON or $Al_2O_3$ and the second insulating material is $SiO_2$, $ZrO_2$ or $HfO_2$.

3. The semiconductor device according to claim 1, further comprising:
   a first opening formed through the lower protective film; and
   a second opening formed through the upper protective film, wherein the leg portion is disposed in the first opening and the second opening.

4. The semiconductor device according to claim 1, wherein neither the lower protective film nor the upper protective film extends on the source electrode and the drain electrode.

* * * * *